US010097928B2

(12) United States Patent
Rusconi Clerici Beltrami et al.

(10) Patent No.: US 10,097,928 B2
(45) Date of Patent: Oct. 9, 2018

(54) MEMS LOUDSPEAKER ARRANGEMENT COMPRISING A SOUND GENERATOR AND A SOUND AMPLIFIER

(71) Applicant: USOUND GMBH, Graz (AT)

(72) Inventors: Andrea Rusconi Clerici Beltrami, Vienna (AT); Ferruccio Bottoni, Graz (AT)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 15/507,303

(22) PCT Filed: Sep. 1, 2015

(86) PCT No.: PCT/EP2015/069900

§ 371 (c)(1),
(2) Date: Feb. 28, 2017

(87) PCT Pub. No.: WO2016/034560

PCT Pub. Date: Mar. 10, 2016

(65) Prior Publication Data

US 2017/0280251 A1 Sep. 28, 2017

(30) Foreign Application Priority Data

Sep. 5, 2014 (DE) .......................... 10 2014 112841

(51) Int. Cl.
*H04R 19/02* (2006.01)
*H04R 1/02* (2006.01)
(Continued)

(52) U.S. Cl.
CPC ............. *H04R 19/02* (2013.01); *H04R 1/025* (2013.01); *H04R 1/403* (2013.01); *H04R 3/12* (2013.01);
(Continued)

(58) Field of Classification Search
CPC ........ H04R 19/02; H04R 19/005; H04R 3/12; H04R 1/403; H04R 1/025; H04R 2201/403; H04R 2201/003
See application file for complete search history.

(56) References Cited

U.S. PATENT DOCUMENTS 9,069,831 B2 6/2015 Cochrane et al.
9,269,831 B2 2/2016 Ehrenpfordt et al.
(Continued)

FOREIGN PATENT DOCUMENTS

CA 2771648 2/2012
DE 102011086722 5/2013
(Continued)

OTHER PUBLICATIONS

Translation of the International Preliminary Report on Patentability, dated Mar. 7, 2017.

(Continued)

*Primary Examiner* — Ping Lee
(74) *Attorney, Agent, or Firm* — Dority & Manning, P.A.

(57) ABSTRACT

A MEMS loudspeaker arrangement for generating sound waves in the audible wavelength spectrum includes a housing that defines a sound-conducting channel and a sound outlet arranged at the end of the sound-conducting channel. At least two MEMS loudspeakers are arranged in the interior of the housing so that they generate sound waves through the sound-conducting channel to the sound outlet. One of the MEMS loudspeakers is disposed downstream of the other in the direction of the sound outlet. A control unit is connected to control the MEMS loudspeakers so as to increase the maximum loudness of the MEMS loudspeaker arrangement. The first of the two MEMS loudspeakers is controlled to function as a sound generator for generating an initial wave,
(Continued)

and the second MEMS loudspeaker is controlled to function as a sound amplifier for amplifying the initial wave.

18 Claims, 2 Drawing Sheets

(51) Int. Cl.
*H04R 3/12* (2006.01)
*H04R 1/40* (2006.01)
*H04R 19/00* (2006.01)

(52) U.S. Cl.
CPC ..... *H04R 19/005* (2013.01); *H04R 2201/003* (2013.01); *H04R 2201/403* (2013.01); *H05K 999/99* (2013.01)

(56) References Cited

U.S. PATENT DOCUMENTS

| | | | |
|---|---|---|---|
| 9,402,137 | B2 | 7/2016 | Hsu et al. |
| 2008/0190206 | A1 | 8/2008 | Matsumoto et al. |
| 2008/0267431 | A1 | 10/2008 | Leidl et al. |
| 2012/0207332 | A1 | 8/2012 | Dehe |
| 2012/0328142 | A1 | 12/2012 | Horibe et al. |

FOREIGN PATENT DOCUMENTS

| | | |
|---|---|---|
| DE | 102012220819 | 5/2013 |
| DE | 102012216996 A1 | 3/2014 |

OTHER PUBLICATIONS

International Search Report (PCT/EP2015/069900), dated Nov. 17, 2015.

MEMS LOUDSPEAKER ARRANGEMENT COMPRISING A SOUND GENERATOR AND A SOUND AMPLIFIER

FIELD OF THE INVENTION

The present invention relates to a MEMS loudspeaker arrangement for generating sound waves in the audible wavelength spectrum and to a method for operating such a MEMS loudspeaker arrangement.

BACKGROUND OF THE INVENTION

The term "MEMS" stands for microelectromechanical systems. MEMS loudspeakers or micro loudspeakers are known, for example, from DE 10 2012 220 819 A1. Sound is generated by a swivel-mounted membrane of the MEMS loudspeaker. As a rule, such a micro-loudspeaker must generate a high air volume displacement in order to achieve a significant sound pressure level. Known MEMS loudspeakers have the disadvantage that they must have a relatively large construction volume in order to be able to achieve a sufficient sound pressure level.

SUMMARY OF THE INVENTION

The task of the present invention is to eliminate the disadvantages of the state of the art.

The task is achieved by a MEMS loudspeaker arrangement along with a method for operating such a MEMS loudspeaker arrangement having the characteristics described below.

A MEMS loudspeaker arrangement for generating sound waves in the audible wavelength spectrum is proposed. It comprises a housing that features a sound-conducting channel and a sound outlet arranged at the end of the sound-conducting channel. Furthermore, the MEMS loudspeaker arrangement comprises at least two MEMS loudspeakers. These are arranged in the interior of the housing in such a manner that the sound waves generated by the MEMS loudspeakers can be conducted to the common sound outlet via the common sound-conducting channel. Moreover, the MEMS loudspeaker arrangement comprises a control unit for controlling the MEMS loudspeakers. Of the at least two MEMS loudspeakers, one of the two is downstream of the other in the direction of the sound outlet. Thereby, the downstream MEMS loudspeaker can influence the sound waves generated by the upstream MEMS loudspeaker, since they are moved past it due to the common sound-conducting channel. The control unit is formed in such a manner that the two MEMS loudspeakers can be controlled by means of it to increase the maximum loudness of the MEMS loudspeaker arrangement in such a manner that the first of the two MEMS loudspeakers—that is, that MEMS loudspeaker, the sound waves of which must travel the longer distance to the common sound outlet—formed as a sound generator for generating an initial wave and the second MEMS loudspeaker downstream of this—that is, that MEMS loudspeaker, the sound waves of which must travel a shorter distance to the sound outlet compared to the first MEMS loudspeaker—is formed as a sound amplifier for amplifying this initial wave. Thereby, the sound pressure of the MEMS loudspeaker arrangement can advantageously be increased, by which the maximum loudness can be elevated. In addition to this increase in performance, through such a formation of the MEMS loudspeaker arrangement, its construction volume can also be kept small. Accordingly, the result is a compact MEMS loudspeaker arrangement with very good acoustic performance.

It is advantageous if a membrane deflection axis of at least one MEMS loudspeaker extends transversely to the sound-conducting channel and/or to a longitudinal axis of the housing. Thereby, the MEMS loudspeaker arrangement can be formed to be very compact. Furthermore, any number of MEMS loudspeakers can be connected in series.

It is also advantageous if the length of the sound-conducting channel from the sound generator to the common sound outlet is greater than the length from the sound amplifier to the sound outlet. As a result, the sound waves generated by the sound generator must travel a longer distance in the common sound-conducting channel than the sound waves generated by the sound amplifier. Furthermore, the sound waves generated by the sound generator are thereby advanced past the downstream sound amplifier, such that the latter can be influenced by the sound waves generated by the sound generator. Thereby, through the corresponding control of the sound amplifier, an increase in the amplitude of the initial wave emitted by the sound generator can be effected.

In order to minimize the influencing of the sound waves introduced into the sound-conducting channel through the spatial geometry of the sound-conducting channel, it is advantageous if the sound-conducting channel extends in the longitudinal direction of the MEMS loudspeaker arrangement and/or is formed at least in the area of the MEMS loudspeakers in a straight line, in particular with side walls that are even or parallel to each other. In this connection, it is particularly advantageous if the sound-conducting channel essentially has a cuboid-shaped geometry. In this case, the MEMS loudspeakers are preferably arranged on the side wall (in particular the same side wall) of the cuboid-shaped sound-conducting channel.

The MEMS loudspeaker arrangement can be formed to be highly compact and structurally simple, if the common sound outlet is formed at one end, in particular at a front side, of the housing.

It is advantageous if the sound generator and the sound amplifier are arranged next to each other. It is also advantageous if they are arranged relative to each other in such a manner that their membrane deflection axes extend parallel to each other and/or perpendicular to a longitudinal axis of the housing. This can reduce disrupting factors of influence on the sound propagation in the sound-conducting channel.

In an advantageous additional form of the invention, the sound generator and the at least one sound amplifier have a common cavity, in particular on its side turned away from the sound-conducting channel. This common cavity is preferably formed at least partially by a housing cavity. In addition, a carrier substrate hollow of the respective MEMS loudspeaker can form an extension of the common cavity.

Furthermore, this common cavity can preferably extend over the entire width of all of the MEMS loudspeakers arranged along the sound-conducting cavity. Due to the fact that several MEMS loudspeakers share a common cavity, the spring effect of the air within the cavity can be advantageously reduced, since the cavity volume of each individual MEMS loudspeaker is increased to the entire volume of the common cavity.

In order to generate a constructive interference, with which the amplitude of a sound wave is increased, it is advantageous if the sound generator and the at least one sound amplifier operate in the same frequency range.

Furthermore, it is advantageous for the control of an optimal superimposition of two sound waves if the sound generator and the at least one sound amplifier have acoustical properties that are different from each other. Accordingly, it is particularly advantageous if they have membrane sizes and/or maximum membrane deflections that are different from each other.

It is advantageous if the sound generator and the sound amplifier are formed as separate components. In this case, each of these preferably has its own membrane. This is also held in a swingable manner, in particular, by a support frame along its membrane deflection axis.

Alternatively, or in addition, it is likewise advantageous if at least two MEMS loudspeakers are formed as a single component with a common membrane, whereas, preferably, each of such MEMS loudspeakers is assigned with a membrane area that is separately controllable and/or vibration-isolated from the membrane area of the other MEMS loudspeaker.

It is advantageous if the sound generator can be controlled by means of the control unit at a first point in time, in such a manner that an initial wave can be introduced into the sound-conducting channel. In this connection, it is also advantageous if, for generating the initial wave, the membrane or, alternatively, the membrane area of the sound generator can be moved into the sound-conducting channel beginning at a predetermined first point in time and held there for a predetermined duration by means of the control unit.

In order to ensure the superimposition of two sound waves that is as accurate as possible for generating a constructive interference, it is advantageous if a second point in time for controlling the downstream sound amplifier (that is, in particular its membrane) is determined by means of the control unit—in particular as a function of the first point in time and/or the sound-conducting channel length between the sound generator and the sound amplifier.

In order to amplify the volume, it is advantageous if, by means of the control unit, the sound amplifier, in particular at the second point in time previously determined by the control unit, can be controlled in such a manner that, by means of this, a superimposed wave can be generated, such that, from the initial wave and the superimposed wave, a resulting wave can be generated with an amplitude that is higher compared to the initial wave. In this connection, it is also advantageous if, with a corresponding control of the sound amplifier, its membrane and/or its assigned membrane area can be moved into the sound-conducting channel in order to generate the superimposed wave.

It is also advantageous if, by means of the control unit at the second point in time, the membrane of the sound generator remains pressed in the sound-conducting channel, such that, upon the deflection of the sound amplifier, air pressing back in the direction of the sound generator is impeded. As a result, the air volume moved in the direction of the sound outlet can be advantageously increased over the volume that otherwise would be moved in the absence of the blocking disposition of the membrane of the sound generator.

In an advantageous additional form of the invention, the MEMS loudspeaker arrangement features a second sound amplifier. As a result, the sound wave already amplified by the first sound amplifier can be amplified once again. In this connection, it is particularly advantageous if the second sound amplifier is downstream of the first sound amplifier in the direction of the sound outlet. As a result, the second sound amplifier can have an influence on the sound waves amplified by the first sound amplifier.

It is advantageous if, by means of the control unit at a third point in time, in particular a third point in time that the control unit determines, the sound generator can be controlled in such a manner that its membrane can be moved back into its resting position. In addition, or alternatively, it is also advantageous if the membrane of the second sound amplifier can be moved into the sound-conducting channel in order to generate a second superimposed wave, such that, from the first resulting wave and the second superimposed wave, a second resulting wave can be generated with an amplitude that is higher compared to the first resulting wave. In order to achieve a blocking effect, the first sound amplifier preferably remains controlled at the third point in time to remain in a blocking disposition in the sound-conducting channel.

In order to achieve a constructive interference, it is advantageous if the initial wave, the at least one superimposed wave and the at least one resulting wave have the same frequency.

The invention also proposes a method for operating a MEMS loudspeaker arrangement in accordance with the preceding description, whereas the specified characteristics of the method can be present individually or in any combination.

BRIEF DESCRIPTION OF THE DRAWINGS

Further advantages of the invention are described in the following embodiments. The following is shown.

DETAILED DESCRIPTION

Figure 1:
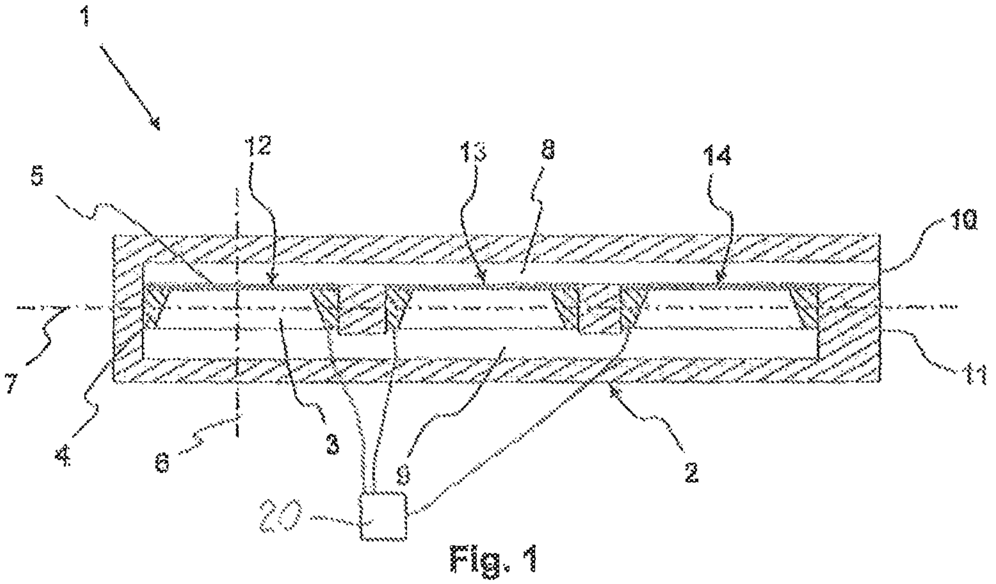
FIG. 1 a longitudinal section through a MEMS loudspeaker arrangement with one MEMS loudspeaker formed as a sound generator and two as sound amplifiers, and FIGS. 2*a*-2*c* the mode of operation of the MEMS loudspeaker arrangement shown in FIG. 1 for increasing the maximum loudness.

FIG. 1 shows a MEMS loudspeaker arrangement 1, by means of which sound waves can be generated in the audible wavelength spectrum. It comprises a housing 2 that is preferably made at least partially of silicon. Multiple MEMS loudspeakers 3 are arranged in the interior of the housing 2, only one of which is provided with a reference sign for the sake of clarity.

The housing 2 is preferably formed in several parts in order to facilitate the mounting of the MEMS loudspeakers 3. In this regard, it is conceivable, for example, for the housing 2 to comprise a middle housing part made in particular from silicon and/or a housing frame in which the MEMS loudspeakers 3 are attached in a positively locking, force-fitting and/or firmly bonded manner. In order to provide a closed internal housing space, the middle housing part and/or the housing frame can be closed on its top side and/or bottom side by a cover. In order to avoid the acoustic excitation of the at least one cover, it is advantageous if this is made of a material that is stiffer in comparison to the middle housing part and/or the housing frame, in particular a metal, a ceramic material and/or a composite material.

In accordance with the embodiment shown in FIG. 1, the MEMS loudspeaker arrangement 13 features a total of three MEMS loudspeakers 3, and variants with only two or more than three MEMS loudspeakers 3 are also conceivable. As can be seen from FIG. 1, such MEMS loudspeakers 3 are formed as separate components. Thus, each of such MEMS loudspeakers 3 comprises a support frame 4, in particular made of silicon. This accommodates a membrane 5 in such a manner that it can be deflected by an electrical control along a membrane deflection axis 6. All of the MEMS loudspeakers 3 operate in the same frequency range. However, contrary to the present exemplary representation, they can have membrane surfaces of different sizes. Furthermore, the MEMS loudspeakers 3 can also have membranes 5 that are able to be deflected to different degrees along the membrane deflection axis 6.

It is also conceivable that at least two MEMS loudspeakers 3 are not formed as separate components, as shown in FIG. 1, but as a single component. In this case, the MEMS loudspeakers would have a common membrane, whereas each of such MEMS loudspeakers would be assigned with a membrane area that is separately controllable and/or vibration-isolated.

In accordance with the present embodiment, the MEMS loudspeakers 3 are arranged in succession next to each other. Thus, their membranes 5 can be deflected in the same direction. Furthermore, the MEMS loudspeakers 3 have distances from each other that are equidistant. Their respective membrane deflection axes 6, only one of which is shown for the sake of clarity, are aligned in a manner parallel to each other. Furthermore, the MEMS loudspeakers 3 are arranged in the interior of the housing 2 in such a manner that their respective membrane deflection axis 6 is aligned perpendicular to the longitudinal axis 7 of the housing 2.

The MEMS loudspeakers 3 have a common sound-conducting channel 8. In accordance with the present embodiment, this extends parallel to the longitudinal axis 7 of the housing 2. The sound-conducting channel 8 is formed in a straight line or is aligned parallel to the longitudinal axis 7. Furthermore, the sound-conducting channel 8 is preferably formed with an essentially cuboid shape. Accordingly, it features even side walls extending in the longitudinal direction. Furthermore, the sound-conducting channel 8 features a constant height and/or width over its entire length.

The MEMS loudspeakers 3 are arranged in succession one adjacent the other along the sound-conducting channel 8. Accordingly, the membrane deflection axes 6 of the MEMS loudspeakers 3 extend transversely to the elongation direction of the common sound-conducting channel 8.

As can be seen from the embodiment shown in FIG. 1, the MEMS loudspeakers 3 have a common cavity 9. The cavity 9 is arranged on the side of the MEMS loudspeakers 3 turned away from the sound-conducting channel 8. It is formed at least partially by a housing cavity. The common cavity 9, in particular the housing cavity, is preferably formed as a cuboid and/or extends in the longitudinal direction of the housing 2 beyond all MEMS loudspeakers 3. The cavity 9 is aligned parallel to the sound-conducting channel 8.

The housing 2 features a sound outlet 10 that is arranged at the end of the common sound-conducting channel 8, such that all MEMS loudspeakers 3 share a single sound outlet 10. In accordance with the present embodiment, the common sound outlet 10 is arranged on a front side 11 of the essentially cuboid-shaped housing.

Thus, in accordance with the foregoing description, the MEMS loudspeakers 3 are arranged in a manner distributed across the length of the common sound-conducting channel 8, in such a manner that they have sound-conducting channel sections of different lengths to the common sound outlet 10. Thus, the length of the section of the sound-conducting channel 8 between the left MEMS loudspeaker 3 in accordance with the figure and the sound outlet 10 is larger than the section of the sound-conducting channel 8 between the middle and/or right MEMS loudspeaker 3 and the common sound outlet 10. Accordingly, in comparison with the other MEMS loudspeakers 3, the sound waves generated by the left MEMS loudspeaker 3 must travel a longer distance in the sound-conducting channel 8 in order to reach the common sound outlet 10.

As schematically shown in FIG. 1 for example, the MEMS loudspeakers 3 can be controlled through a control unit 20 in such a manner that a sound wave generated by the first MEMS loudspeaker 3, which is in particular the furthermost from the sound outlet 10, is amplified by the downstream MEMS loudspeakers 3. As a result, the MEMS loudspeaker arrangement 1 features at least one MEMS loudspeaker 3 formed as a sound generator 12 and at least one MEMS loudspeaker 3 formed as a sound amplifier 13, 14. In accordance with the embodiment illustrated in FIG. 1, the MEMS loudspeaker 3 featuring the longest sound-conducting channel section—that is, the left MEMS loudspeaker 3 in accordance with the figure—is formed as a sound generator 12. The MEMS loudspeakers 3 downstream of such sound generator 12 are consequently formed as sound amplifiers 13, 14. In the following, the MEMS loudspeaker 3 adjacent to the sound generator 12 is designated as the first sound amplifier 13, and the MEMS loudspeaker 3 downstream of the first sound amplifier 13 is designated as the second sound amplifier 14.

Figure 2A:
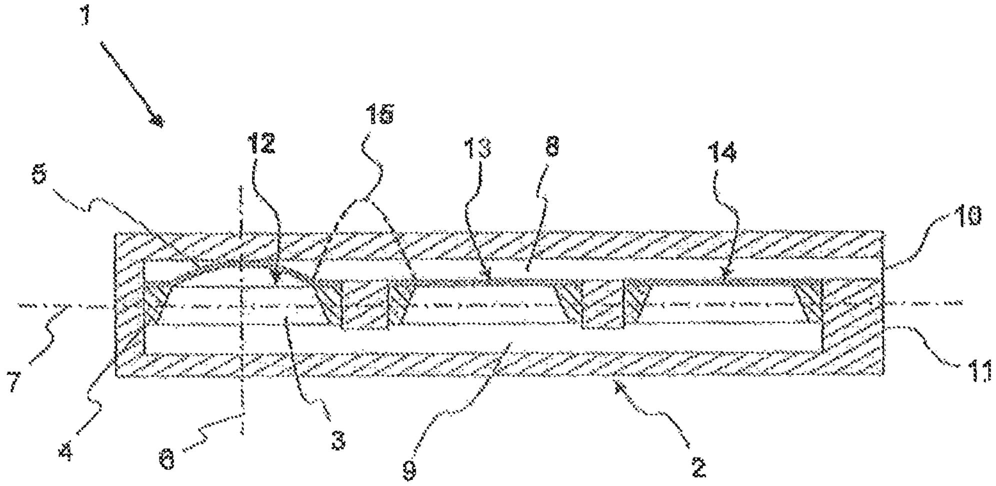
Figure 2B:
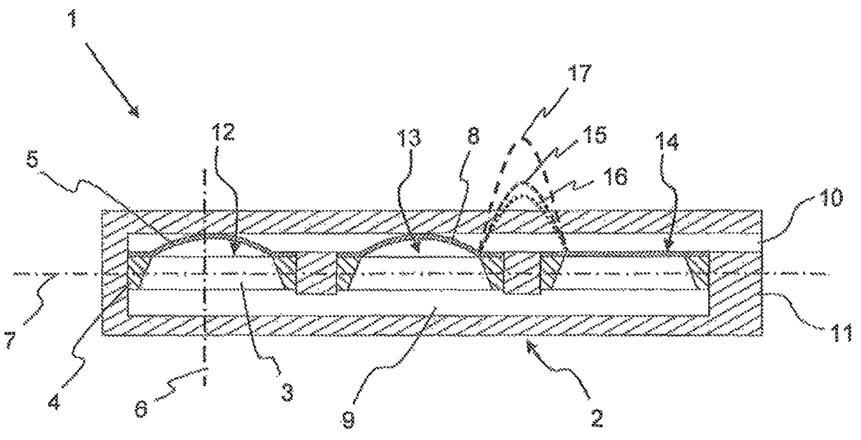
Figure 2C:
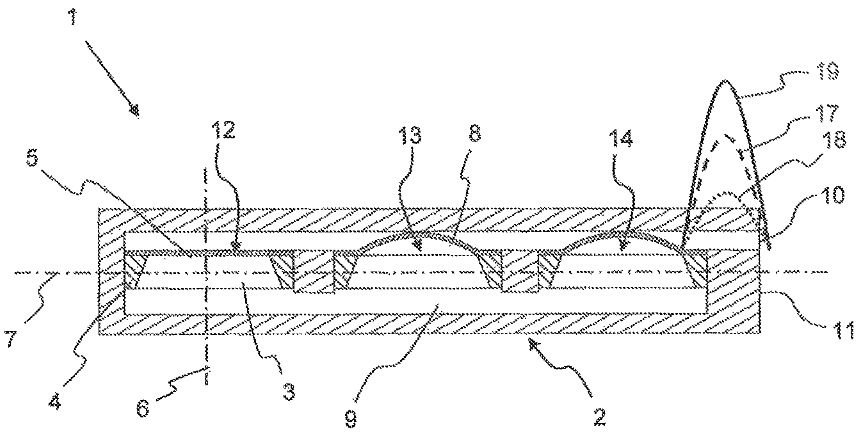

The mode of operation of the MEMS loudspeaker arrangement 1 for increasing the maximum loudness is illustrated in FIGS. 2*a*, 2*b* and 2*c*. Accordingly, in accordance with FIG. 2*a*, the sound generator 12 is controlled at a first point in time, by which a sound wave designated below as the initial wave 15 is generated. For generating the initial wave 15, the membrane 5 of the sound generator 12 accordingly moves into the sound-conducting channel 8, by which a certain air volume is displaced in the direction of the sound outlet 10. It is clear that the sound waves schematically illustrated in FIGS. 2*a* to 2*c* do not correspond to the sound wave generated in reality either in their scale or their contours.

Several parameters concerning the spatial and/or physical configuration of the common sound-conducting channel 8 and/or of the MEMS loudspeakers 3 are known to the control unit 20 (FIG. 1). Thus, the control unit 20 is able to determine a second point in time for controlling the first sound amplifier 13, which is downstream of the sound generator 12, in particular as a function of the first point in time and/or the sound channel length between the sound generator 12 and the first sound amplifier 13.

In accordance with FIG. 2*b*, such second point in time is selected by the control unit 20 in such a manner that a first superimposed wave 16 generated by the first sound amplifier 13 is superimposed on the initial wave 15. Thus, the control unit 20 is able to control the first sound amplifier 13 in such a manner that a constructive interference is generated. As a result, the amplitude of the initial wave 15 is increased by the first superimposed wave 16. This generates a first resulting wave 17, which features a higher amplitude compared to the initial wave 15. Accordingly, the amplitude of the first resulting wave 17 corresponds to the sum of the initial wave 15 and the first superimposed wave 16.

FIG. 2*b* shows that, at least during the deflection phase of the first sound amplifier 13, the sound generator 12 is still also deflected. This prevents air from being pushed back in the direction of the sound generator 12 when the sound amplifier 13 is deflected. Instead, the membrane 5 of the sound generator 12 that is still controlled forms a space occupier, which ensures that as much air as possible is pressed in the direction of the common sound outlet 10 when the first sound amplifier 13 is deflected.

According to FIG. 2*c*, this first resulting wave 17 can be amplified one additional time by the second sound amplifier 14 downstream of the first sound amplifier 13. For this purpose, the control unit 20 determines, in a comparable manner, a third point in time, at which the second sound amplifier 14 is to be controlled. For determining such third point in time, at least the length of the sound-conducting channel 8 between the two sound amplifiers 13, 14 is known to the control unit 20. For the additional amplification of the first resulting wave 17, in accordance with FIG. 2*c*, this is superimposed by a second superimposed wave 18, by which a second resulting wave 19 is generated.

By analogy to the preceding description, with this second amplification, the first sound amplifier 13 is also controlled during the deflection of the second sound amplifier 14, such that its membrane acts as a space occupier. Thus, the air is impeded from flowing backward into the sound-conducting channel 8, and instead tends to be pressed in the direction of the sound outlet 10.

At the same time, as shown in FIG. 2*c*, the sound generator 12 is once again moved into its initial position, whereas this can take place with a reduced force due to the common cavity 9 and the deflected sound amplifiers 13, 14.

This invention is not limited to the illustrated and described embodiments. Variations within the scope of the claims, just as the combination of characteristics, are possible, even if they are illustrated and described in different embodiments.

LIST OF REFERENCE SIGNS

1 MEMS loudspeaker arrangement
2 Housing
3 MEMS loudspeaker
4 Support frame
5 Membrane
6 Membrane deflection axis
7 Longitudinal axis
8 Sound-conducting channel
9 Cavity
10 Sound outlet opening
11 Front surface
12 Sound generator
13 First sound amplifier
14 Second sound amplifier
15 Initial wave
16 First superimposed wave
17 First resulting wave
18 Second superimposed wave
19 Second resulting wave
20 control unit

The invention claimed is:

1. MEMS loudspeaker arrangement for generating sound waves in an audible wavelength spectrum, comprising:

a housing that defines an interior with a sound-conducting channel elongating in a downstream direction to an end thereof, the housing further defining a sound outlet disposed at the end of the sound-conducting channel;

a first MEMS loudspeaker and a second MEMS loudspeaker disposed in the interior of the housing and downstream of the first MEMS loudspeaker in the direction of the sound outlet, wherein the MEMS loudspeakers are disposed so that the sound waves generated by the MEMS loudspeakers conducts downstream through the sound-conducting channel to the sound outlet; and a control unit connected to control the MEMS loudspeakers and configured for controlling the first MEMS loudspeaker to function as a sound generator for generating an initial wave and the second MEMS loudspeaker to function as a sound amplifier for amplifying this initial wave to form a resulting wave; and wherein the housing further defining a common cavity shared by the first MEMS loudspeaker and the second MEMS loudspeaker, wherein the common cavity is disposed in opposition to the sound-conducting channel.

2. MEMS loudspeaker arrangement according to claim 1, wherein at least one of the MEMS loudspeakers includes a membrane having a deflection axis that extends in a direction that is disposed transversely to the downstream direction of the sound-conducting channel.

3. MEMS loudspeaker arrangement according to claim 1, wherein the distance between the first MEMS loudspeaker and the sound outlet is greater than the distance between the second MEMS loudspeaker and the sound outlet.

4. MEMS loudspeaker arrangement according to claim 1, wherein the sound-conducting channel between the two MEMS loudspeakers is defined by a pair of side walls that are parallel to each other.

5. MEMS loudspeaker arrangement according to claim 4, wherein the side walls, which are parallel to each other in defining the sound-conducting channel, extend in the longitudinal direction and have the same constant height over their entire lengths.

6. MEMS loudspeaker arrangement according to claim 1, wherein each of the MEMS loudspeakers includes a membrane having a deflection axis that extends in a direction that is disposed transversely to the downstream direction of the sound-conducting channel.

7. MEMS loudspeaker arrangement according to claim 1, wherein the side walls that are parallel to each other in defining MEMS loudspeakers includes a membrane having a deflection axis that extends in a direction that is disposed parallel to each other.

8. MEMS loudspeaker arrangement according to claim 1, wherein the housing further defining a common cavity shared by first MEMS loudspeaker and the second MEMS loudspeaker.

9. MEMS loudspeaker arrangement according to claim 1, wherein each of the MEMS loudspeakers operates in the same frequency range, yet each of the MEMS loudspeakers has a differently sized membrane than the other MEMS loudspeaker.

10. MEMS loudspeaker arrangement according to claim 1, wherein each of the MEMS loudspeakers operates in the same frequency range, yet each of the MEMS loudspeakers has a membrane with a maximum membrane deflection that differs from the maximum membrane deflection of the other MEMS loudspeaker.

11. MEMS loudspeaker arrangement according to claim 1, wherein the first MEMS loudspeaker includes a first membrane and the second MEMS loudspeaker includes a second membrane that is not physically attached to the first membrane, and wherein the first membrane is separately controllable from the second membrane.

12. MEMS loudspeaker arrangement according to claim 1, wherein the first MEMS loudspeaker includes a first membrane and the second MEMS loudspeaker includes a second membrane that is not physically attached to the first membrane, and wherein the first membrane is vibration-isolated from the second membrane.

13. MEMS loudspeaker arrangement according to claim 1, further comprising a third MEMS loudspeaker disposed downstream of the second MEMS loudspeaker in the direction of the sound outlet.

14. MEMS loudspeaker arrangement according to claim 13, wherein the control unit is configured so that the third MEMS loudspeaker is controlled in such a manner to function as a sound amplifier for amplifying the resulting wave to form a twice-amplified wave.

15. MEMS loudspeaker arrangement according to claim 14, wherein the initial wave, the resulting wave and the twice-amplified wave have the same frequency.

16. MEMS loudspeaker arrangement for generating sound waves in an audible wavelength spectrum, comprising:

a housing that defines an interior with a sound-conducting channel elongating in a downstream direction to an end thereof, the housing further defining a sound outlet disposed at the end of the sound-conducting channel;

a first MEMS loudspeaker and a second MEMS loudspeaker disposed in the interior of the housing and downstream of the first MEMS loudspeaker in the direction of the sound outlet, wherein the MEMS loudspeakers are disposed so that the sound waves generated by the MEMS loudspeakers conducts downstream through the sound-conducting channel to the sound outlet; and a control unit connected to control the MEMS loudspeakers and configured for controlling the first MEMS loudspeaker to function as a sound generator for generating an initial wave and the second MEMS loudspeaker to function as a sound amplifier for amplifying this initial wave to form a resulting wave;

wherein the first MEMS loudspeaker and the second MEMS loudspeaker share a common membrane.

17. MEMS loudspeaker arrangement according to claim 16, wherein the common membrane is defined by a first membrane area of the first MEMS loudspeaker and a second membrane area of the second MEMS loudspeaker, and wherein the first membrane area is separately controllable from the second membrane area.

18. MEMS loudspeaker arrangement according to claim 16, wherein the common membrane is defined by a first membrane area of the first MEMS loudspeaker and a second membrane area of the second MEMS loudspeaker, and wherein the first membrane area is vibration-isolated from the second membrane area.

* * * * *

UNITED STATES PATENT AND TRADEMARK OFFICE

CERTIFICATE OF CORRECTION

PATENT NO. : 10,097,928 B2
APPLICATION NO. : 15/507303
DATED : October 9, 2018
INVENTOR(S) : Andrea Rusconi Clerici Beltrami It is certified that error appears in the above-identified patent and that said Letters Patent is hereby corrected as shown below:

On the Title Page

First named inventor's information currently reads "Andrea Rusconi Clerici Beltrami, Hamburg (DE)" inventor's information should read "Andrea Rusconi Clerici Beltrami, Wien (AT)"

Signed and Sealed this
Twenty-third Day of July, 2019

Andrei Iancu
*Director of the United States Patent and Trademark Office*